(12) United States Patent
Stokowski

(10) Patent No.: US 8,711,346 B2
(45) Date of Patent: Apr. 29, 2014

(54) INSPECTION SYSTEMS AND METHODS FOR DETECTING DEFECTS ON EXTREME ULTRAVIOLET MASK BLANKS

(75) Inventor: Stanley E. Stokowski, Danville, CA (US)

(73) Assignee: KLA-Tencor Corporation, Milpitas, CA (US)

(*) Notice: Subject to any disclaimer, the term of this patent is extended or adjusted under 35 U.S.C. 154(b) by 149 days.

(21) Appl. No.: 12/811,200

(22) PCT Filed: Jun. 10, 2010

(86) PCT No.: PCT/US2010/038202
§ 371 (c)(1),
(2), (4) Date: Apr. 13, 2011

(87) PCT Pub. No.: WO2010/147846
PCT Pub. Date: Dec. 23, 2010

(65) Prior Publication Data
US 2011/0181868 A1   Jul. 28, 2011

Related U.S. Application Data

(60) Provisional application No. 61/218,866, filed on Jun. 19, 2009, provisional application No. 61/249,920, filed on Oct. 8, 2009.

(51) Int. Cl.
*G01N 21/00* (2006.01)
(52) U.S. Cl.
USPC .......................... 356/237.2; 356/237.5; 430/5
(58) Field of Classification Search
USPC ......... 356/237.1–237.5, 51, 394; 250/559.45, 250/559.46, 548
See application file for complete search history.

(56) References Cited

U.S. PATENT DOCUMENTS 6,327,033 B1 * 12/2001 Ferguson et al. ............. 356/394
6,727,512 B2 *  4/2004 Stokowski et al. ...... 250/559.45
(Continued)

FOREIGN PATENT DOCUMENTS

JP    01185434 A    7/1989
JP    04328549 A   11/1992
(Continued)

OTHER PUBLICATIONS

WO patent application No. PCT/US2010/038202, International Search Report mailed Jan. 17, 2011.
(Continued)

*Primary Examiner* — Hoa Pham
(74) *Attorney, Agent, or Firm* — Kwan & Olynick LLP

(57) ABSTRACT

Provided are novel inspection methods and systems for inspecting unpatterned objects, such as extreme ultraviolet (EUV) mask blanks, for surface defects, including extremely small defects. Defects may include various phase objects, such as bumps and pits that are only about 1 nanometer in height, and small particles. Inspection is performed at wavelengths less than about 250 nanometers, such as a reconfigured deep UV inspection system. A partial coherence sigma is set to between about 0.15 and 0.5. Phase defects can be found by using one or more defocused inspection passes, for example at one positive depth of focus (DOF) and one negative DOF. In certain embodiments, DOF is between about −1 to −3 and/or +1 to +3. The results of multiple inspection passes can be combined to differentiate defect types. Inspection methods may involve applying matched filters, thresholds, and/or correction factors in order to improve a signal to noise ratio.

37 Claims, 8 Drawing Sheets

(56) References Cited

U.S. PATENT DOCUMENTS

| | | | |
|---|---|---|---|
| 6,879,406 B1* | 4/2005 | Rangarajan et al. | 356/625 |
| 7,072,502 B2* | 7/2006 | Hemar et al. | 382/144 |
| 7,093,229 B2* | 8/2006 | Pang et al. | 716/52 |
| 7,107,571 B2* | 9/2006 | Chang et al. | 716/52 |
| 7,659,042 B2* | 2/2010 | Pierrat | 430/5 |
| 7,738,093 B2 | 6/2010 | Alles et al. | |
| 2002/0036772 A1* | 3/2002 | Koizumi et al. | 356/237.5 |
| 2003/0067598 A1 | 4/2003 | Tomie | |
| 2003/0103189 A1* | 6/2003 | Neureuther et al. | 351/176 |
| 2004/0207836 A1 | 10/2004 | Chhibber et al. | |
| 2005/0201514 A1 | 9/2005 | Mann et al. | |
| 2005/0243390 A1* | 11/2005 | Tejnil | 359/15 |
| 2006/0275675 A1* | 12/2006 | Hirscher et al. | 430/5 |
| 2007/0156379 A1* | 7/2007 | Kulkarni et al. | 703/14 |
| 2007/0188743 A1* | 8/2007 | Tanaka et al. | 356/237.1 |
| 2008/0218747 A1* | 9/2008 | Stokowski | 356/73 |
| 2008/0318138 A1* | 12/2008 | Holfeld | 430/5 |
| 2009/0091750 A1* | 4/2009 | Urano et al. | 356/237.3 |
| 2009/0091752 A1 | 4/2009 | Terasawa et al. | |
| 2009/0296096 A1* | 12/2009 | Jeong | 356/450 |
| 2010/0238433 A1* | 9/2010 | Lange et al. | 356/237.2 |
| 2012/0307218 A1* | 12/2012 | Kamo | 355/52 |
| 2013/0065163 A1* | 3/2013 | Tanaka | 430/5 |

FOREIGN PATENT DOCUMENTS

| | | |
|---|---|---|
| JP | 2005514670 A | 5/2005 |
| JP | 2005525565 A | 8/2005 |
| JP | 2009092407 A | 4/2009 |
| WO | 03058681 A2 | 7/2003 |

OTHER PUBLICATIONS

WO patent application No. PCT/US2010/038202, Written Opinion mailed Jan. 17, 2011.

Broadbent, William H. et al., "Results from a New Die-to-Database Reticle Inspection Platform", Proceedings of SPIE, vol. 5446, Photomask and Next-Generation Lithography Mask Technology XI, Aug. 20, 2004, pp. 265-278.

Broadbent, William H. et al., "Results from a New Reticle Defect Inspection Platform", Proceedings of SPIE, vol. 5256, 23rd Annual BACUS Symposium on Photomask Technology, 2003, pp. 474-488.

"Korean Application Serial No. 10-2012-7001643, Office Action mailed Jul. 29, 2013", 11 pgs.

Japanese Application Serial No. 2012-516140, Office Action mailed Feb. 4, 2014, 9 pgs.

Chinese Application Serial No. 201080028829.2, Office Action mailed Dec. 9, 2013, 21 pgs.

* cited by examiner

INSPECTION SYSTEMS AND METHODS FOR DETECTING DEFECTS ON EXTREME ULTRAVIOLET MASK BLANKS

CROSS-REFERENCE TO RELATED APPLICATIONS

This application is a U.S. national application under 35 U.S.C. 371 of PCT Application No. PCT/US2010/038202 filed on Jun. 10, 2010, entitled "Inspection System and Method for Detecting Defects on Extreme Ultraviolet Mask Blanks, which claims the benefit of U.S. Provisional Application No. 61/249,920, filed Oct. 8, 2009, entitled "Inspection System and Method for Detecting Defects on EUV (Extreme Ultraviolet) Mask Blanks" and also claims the benefit of U.S. Provisional Application No. 61/218,866, filed Jun. 19, 2009, entitled "Inspection System and Method for Detecting Defects on EUV (Extreme Ultraviolet) Mask Blanks" PCT Application No. PCT/US2010/038202, U.S. Provisional Application No. 61/249,920 and U.S. Provisional Application No. 61/218,866 are incorporated herein by reference in their entirety for all purposes.

BACKGROUND

Some current state of the art photolithography techniques use 193 nanometers ultraviolet (UV) light sources to image patterns onto silicon substrates. This type of technique can produce technology nodes (e.g., size of smallest feature, such as ½ pitch of parallel lines) that are about 200-250 nanometers in size. However, faster and more complex integrated circuits continuously demand smaller nodes. An immersion photolithography makes some improvement in this regard and allows production of 45 nanometer nodes and even 32 nanometer nodes. In an immersion photolithography, a final lens of the lithography system and the sample are both immersed into a liquid medium, such as water. This arrangement, in turn, can create many processing issues.

Other "next generation" photolithography techniques have been recently proposed to produce even smaller nodes. Some promising examples include extreme ultraviolet (EUV) lithography, X-ray lithography, electron beam lithography, focused ion beam lithography, and nano-imprint lithography. These new approaches can result in new challenges. For example, nano-imprint lithography can produce bubble defects, while EUV lithography can be very susceptible to even minor mask defects.

SUMMARY

Provided are novel inspection methods and systems for inspecting unpatterned objects, such as extreme ultraviolet (EUV) mask blanks, for surface defects, including extremely small defects. Defects may include various phase objects, such as bumps and pits that are only about 1 nanometer in height, and small particles. Inspection is performed at wavelengths less than about 250 nanometers, such as a reconfigured deep UV inspection system. A partial coherence sigma is set to between about 0.15 and 0.5. Phase defects can be found by using one or more defocused inspection passes, for example at one positive depth of focus (DOF) and one negative DOF. In certain embodiments, DOF is between about −1 to −3 and/or +1 to +3. The results of multiple inspection passes can be combined to differentiate defect types. Inspection methods may involve applying matched filters, thresholds, and/or correction factors in order to improve a signal to noise (SNR) ratio.

In certain embodiments, a method for inspecting phase defects and/or particles on a surface of an unpatterned object involves generating an illuminating light beam having a wavelength of less than about 250 nanometers, passing the illuminating light beam through a set of optical elements with a partial coherence sigma to between about 0.15 and 0.5, focusing the illuminating tight beam onto the surface of the unpatterned object at a predetermined defocus range, inspecting the surface of the unpatterned object with the illuminating light beam so that a reflected light beam reflects from the surface, and, based on the reflected light beam, constructing and analyzing a resultant image to identify the phase defects.

In certain embodiments, phase defects are less than about 10 nanometers in height and less than about 200 nanometers in a full width at half maximum (FWHM). More specifically, phase defects may be less than about 2 nanometers in height and less than about 100 nanometers in FWHM. A defocus range may be between about +1 and +3 depth of field (DOF) or between about −1 and −3 DOF.

In certain embodiments, a method also involves a second illuminating light beam onto a surface of the unpatterned object at a second predetermined defocus range. One beam may be at a defocus range of between about +1 and +3 depth of field (DOF), while another beam may be at a defocus range of between about −1 and −3 DOF. The method may involve capturing the reflected light beam with a time delay integration (TDI) detector. A path of the reflected light beam may be between about 100 pixels and 1000 pixels wide along a scanning direction defined by a resolution of the TDI detector.

In certain embodiments, an illuminating light beam is a deep UV beam or an extreme UV beam. In a specific embodiment, an illuminating light beam has a wavelength of about 193 nanometers. A partial coherence sigma may be between about 0.2 and 0.4.

In certain embodiments, analyzing a resultant image involves constructing and applying a filter to the resultant image or a detected signal generated from the reflected light beam so as to maximize a signal-to-noise (SNR) ratio in the resultant image or detected signal. In certain embodiments, a method also involves applying a correction factor to remove a systematic noise comprising TDI calibration effects from the resultant image. For example, a correction factor may be determined and applied during inspection from initial capturing of the reflected light beam. In the same or other embodiments, a correction factor may be determined from intensity variations of a reflected light. In certain embodiments, the method involves applying a threshold signal value of at least about 9 to detect phase defects.

In certain embodiments, an unpatterned object inspected with the novel methods is an Extreme Ultraviolet Mask (EUV) blank. More generally, an unpatterned object may be a transmissive object. In certain embodiments, a surface of an unpatterned object includes quartz or an anti-reflective coating (ARC).

In certain embodiments, a method involves capturing reflected light with a dual-field TDI detector configured to construct two initial images of the surface of an unpatterned object. The two initial images may be constructed for two different defocus values. For example, two different defocus values may be opposite in sign. In certain embodiments, the two initial images include a focused image constructed for a DOF of about zero. The focused image may be used to detect contaminations on an inspected surface of the unpatterned object. A method may also involve classifying defects into phase defects and surface contamination defects based on comparison of the two initial images. In the same or other embodiments, the two initial images may be summed up to get a resultant image.

In certain embodiments, a method also includes performing additional inspection passes of a surface of an unpatterned object and constructing additional resultant images that are combined with a resultant image to increase a signal-to-noise ratio. In certain embodiments, an illuminating light beam is focused onto a surface of an unpatterned object at a substantially normal angle. The illuminating light beam and the reflected light beam share their paths. In other embodiments, an illuminating light beam is focused onto a surface of an unpatterned object at an oblique angle. The illuminating light beam and the reflected light beam do not share their paths. In these embodiments, a method may also involve attenuating a zero order component of the reflected light beam and/or shifting a phase of the zero order component of the reflected light beam using an imaging aperture to improve the contrast and a signal-to-noise ratio.

In certain embodiments, a system for inspecting surface unevenness defects of less than about 10 nanometers in depth on a surface of an unpatterned object is provided. A system may include a laser for generating an illuminating light beam having a wavelength less than about 250 nanometers and a set of optical elements with a partial coherence sigma to between about 0.15 to 0.5 for focusing the illuminating light beam onto a surface of an unpatterned object within a focus range of between about −3 to +3 depth of field (DOF). A system may also include a stage for moving an unpatterned object with respect to a illuminating light beam to inspect the surface of the object, a time delay integration (TDI) detector for capturing a reflected light beam reflected from the surface in response to the illuminating beam, and a computer system comprising at least one memory and at least one processor for, based on the reflected light beam, constructing a resultant image and analyzing the resultant image to identify the surface unevenness defects.

These and other aspects of the invention are described further below with reference to the figures.

DETAILED DESCRIPTION OF EXAMPLE EMBODIMENTS

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

Introduction

Novel inspection methods described herein can be used for inspection of extreme ultraviolet (EUV) mask blanks and other semiconductor components. In a specific example, a multilayer EUV mask blank is inspected for phase defects, such as bumps and pits, using a specifically configured deep ultraviolet (DUV) inspection system. These methods can be used to detect defects as small 1 nanometer in height and 50 nanometers in full width half maximum (FWHM). In other words, these techniques meet inspection goals of 22 nanometer half-pitch (hp) nodes and could be performed at high throughput speeds. An inspection system is configured with a partial coherence sigma of between about 0.15 and 0.5. A reflected light may be captured by a time delay integration (TDI) detector and passed to a computer system for analysis. A signal to noise ratio (SNR) can be improved by applying specially designed filters, thresholds, and correction factors.

Figure 1:
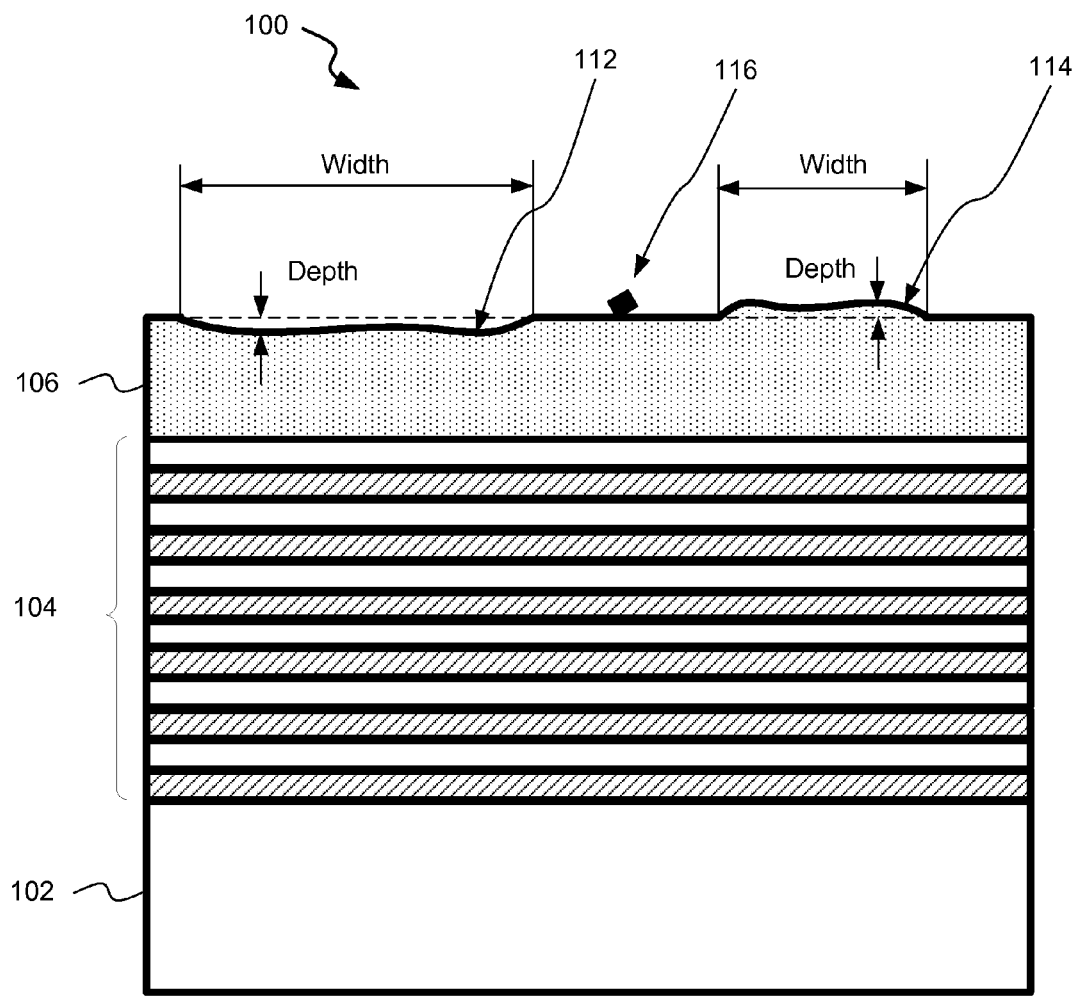
FIG. 1 is a side view schematic representation of an extreme ultraviolet (EUV) mask blank exemplifying various types of defects.

FIG. 1 is a side view schematic representation of a EUV mask blank in accordance with certain embodiments. A EUV mask blank typically includes a substrate 102, such a low thermal expansion (LTE) glass sheet. The substrate is covered with multiple layers 104 of materials to provide good reflectance at the EUV wavelength for doing lithographic exposure. In certain embodiments, the multiple layers 104 include 30-40 iterating pairs of molybdenum (Mo) and silicon (Si) layers arranged with about 7 nanometer pitch. The multiple layers 104 may include a capping layer 106. In other embodiments, a sample may include quartz, antireflective coating (ARC), and other features.

EUV mask blanks and other sample sometimes have surface defects. The defects can be generally characterized as phase defects, such as pit 112 and bump 114, and particles 116. These bumps and pits usually arise from defects at the substrate, 102. Thus, the layers are typically also distorted. While bumps and pits are almost purely optical phase objects, particles have both amplitude and phase characteristics. Both types of defects can be very damaging to EUV lithography and need to be carefully screened for. For example, a phase shift caused by a 1 nanometer bump is sufficient to produce a printable defect.

Actinic (e.g., 13.5 nanometers) inspection tools can be used for inspection of these defects, but these tools are not expected to be available for several years in high throughput configurations suitable for non-academic uses. Currently available systems have either throughput or sensitivity limitations. For example, multi-beam confocal microscopes supplied by LaserTec in Yokohama, Japan detect surface disturbances by monitoring reflective signals. However, these microscopes have a poor sensitivity and are generally not suitable for inspection of EUV mask blank defects, Higher illumination powers could improve the sensitivity but they are often damaging to EUV mask blanks Dark-field 13.5 nanometer microscopes have been proposed for EUV mask blank inspection, but these dark-field systems can be extremely slow and may not suitable for production uses.

It has been found that a DUV inspection system can be configured for inspection of small surface defects on EUV mask blanks and other similar samples. In accordance with a specific embodiment, the Teron 600 inspection system, available from KLA Tencor in Milpitas, Calif., has been reconfigured for inspection phase defects as small as 1 nanometer in height and 80 nanometers FWHM on typical EUV mask blanks Inspection results were compared to those obtained from an actinic Advanced Inspection Tool at Lawrence Berkeley National Laboratory in Berkeley, Calif. and found to be consistent between the two inspection systems. Some experimental results are described in more details below. It has been also found that DUV systems can be also configured for inspecting particle defects.

Optical inspection principles will now be briefly explained in order to provide a context for various defect detection techniques proposed herein. Dark field detection involves collection and analysis of scattered radiation from the surface. This technique is sensitive to small defects, such as particles and sharp edges. But some surface topography, such as large shallow defects, and some crystallographic defects, such as slip lines and stacking faults, may not scatter light efficiently. Bright field detection refers to collection and analysis of reflected radiation from the surface. This technique is sensitive to variations (e.g., slope) over the inspected surface. Various aspects of reflected light in the bright field detection may reveal useful information about the surface. For example, an intensity of the reflected light may reveal surface material information. A phase and direction of the reflected light may on the other hand also reveal surface topography and material information.

Figure 2:
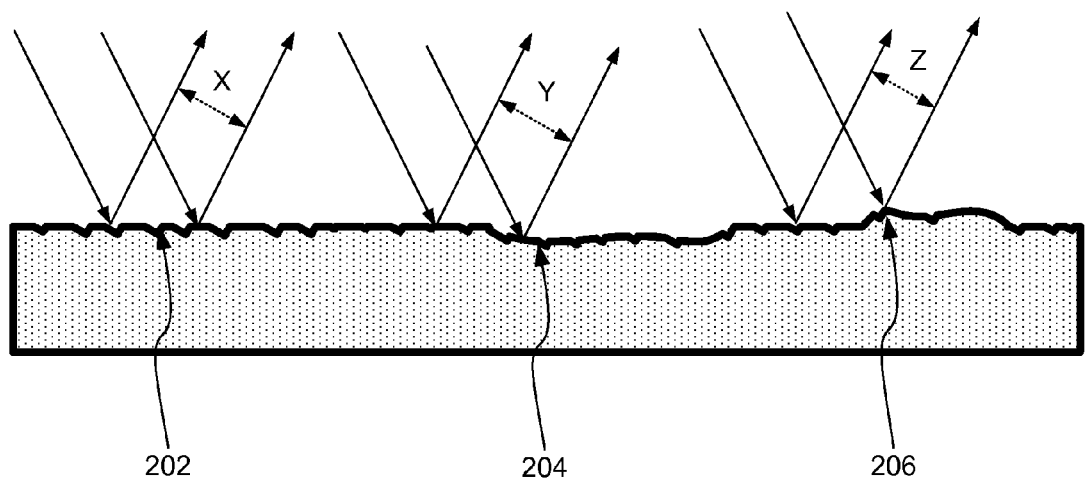
FIG. 2 is a side view schematic illustration of a surface of a EUV mask blank exemplifying detection of two types of phases defects in accordance with certain embodiments.

FIG. 2 is a side view schematic illustration of a EUV mask blank surface exemplifying an inspection of two types of phase defects in accordance with certain embodiments. A substantially flat portion 202 of the inspected surface is shown as a reference to illustrate phase shift differences in the light beams reflected from the pit 204 and the bump 206. It should be noted that a surface roughness produces some additional phase fluctuations, which become a part of the overall background noise. A surface roughness is generally consistent across the entire sample surface, which includes both flat portions (such as element 202) as well defects (such as elements 204 and 206). As such, a roughness can be at least partially compensated for by applying a specifically designed filter. Such filter could substantially increase a signal to noise ratio.

When the pit 204 is inspected, the reflected light has the same amplitude as the reflected light from the flat portion 202. However, the reflected light from the pit 204 has a negative phase difference (Y) when compared to that of the flat surface (X). Likewise, when the bump 206 is inspected, the reflected light has the same amplitude, but it now has a positive phase difference (Z) in comparison to the reference (X). In certain embodiments, a portion of the inspected surface or the entire surface can be used as a phase value reference in order to determine phase shifts.

An optical amplitude (D) for laterally small defects can be expressed with the following formula:

$D = \exp(i\phi)S = 1$

A phase ($\phi$) corresponds to the mean defect phase integrated over a point spread function. An optical amplitude (S) of the flat surroundings is set to one. An image contrast can be achieved by mixing multiple optical amplitudes using a point spread function. Thus, the defect intensity contrast can be expressed with the following formula:

$$\text{Contrast} \approx |S|^2 - \left|\frac{S+D}{2}\right|^2 = -\frac{1}{2}[1-\cos(\phi)] = -\frac{1}{2}\sin^2(\phi/2) \cong -\frac{\phi^2}{8}$$

For small phase values ($\phi$), the sinusoidal function can be approximated as a linear function.

Figure 3:
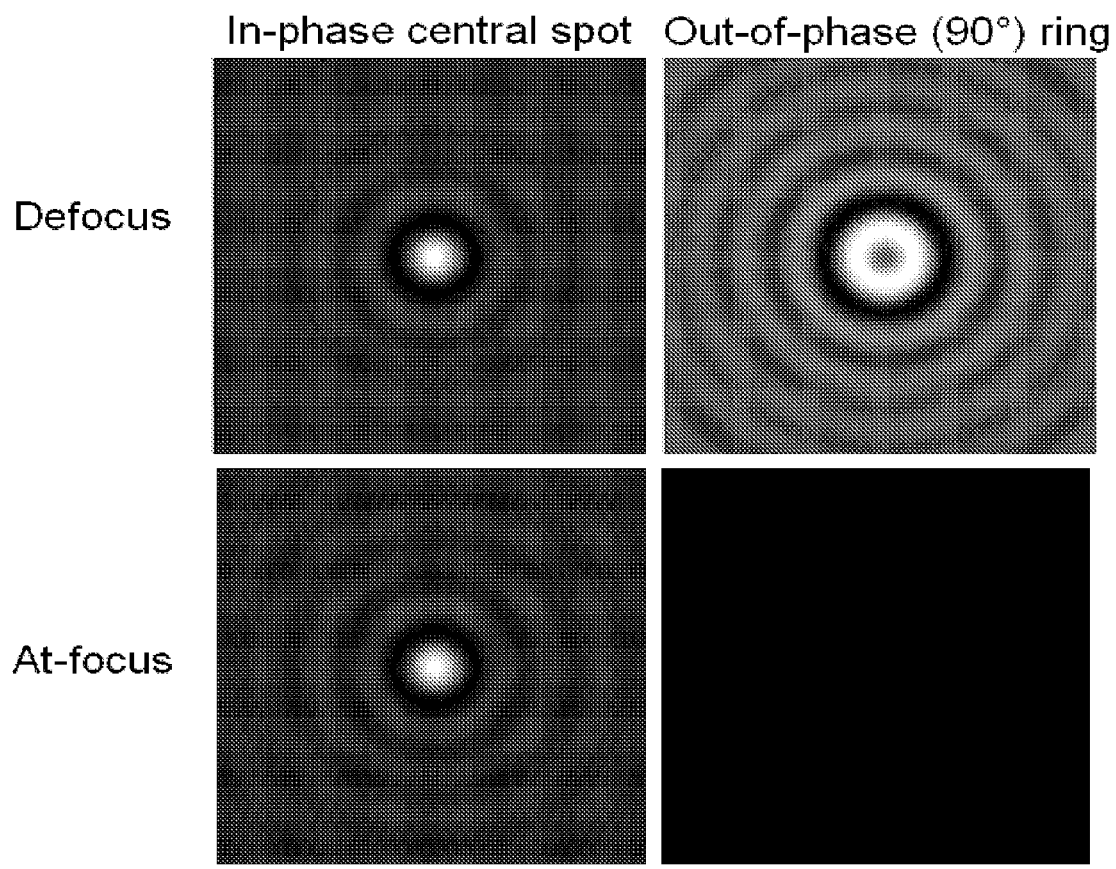
FIG. 3 illustrates four simulated images of the optical system point spread function at a focal point and a certain defocused point and shown as an in-phase central spot and out-of-phase (90° C.) ring.

However, a contrast value is relatively small for shallow defects. In order to increase the contrast, an illuminating light beam can be defocused to shift the relative phases of the flat surroundings (S) and defect (D). At a focus (depth of focus (DOF) about equal to 0), the point spread function has only a real part. However, under defocus conditions (DOF<0 or DOF>0), the point spread function has an imaginary part that corresponds to a ring shape. This phenomena is illustrated in FIG. 3, which has four simulated images of the optical point spread function at a focal point and a certain defocused point. The images were captured as both an in-phase central spot and an out-of-phase (90° C.) ring. In other words, the image contrast can be achieved by mixing of a central spot and a ring, which are 90° out of phase with respect to each other. As such, the contrast can be expressed with the following formula:

$$\text{Contrast} \approx |S|^2 - \left|\frac{S+iD}{\sqrt{2}}\right|^2 = \sin(\phi) \approx \phi$$

Figure 4:
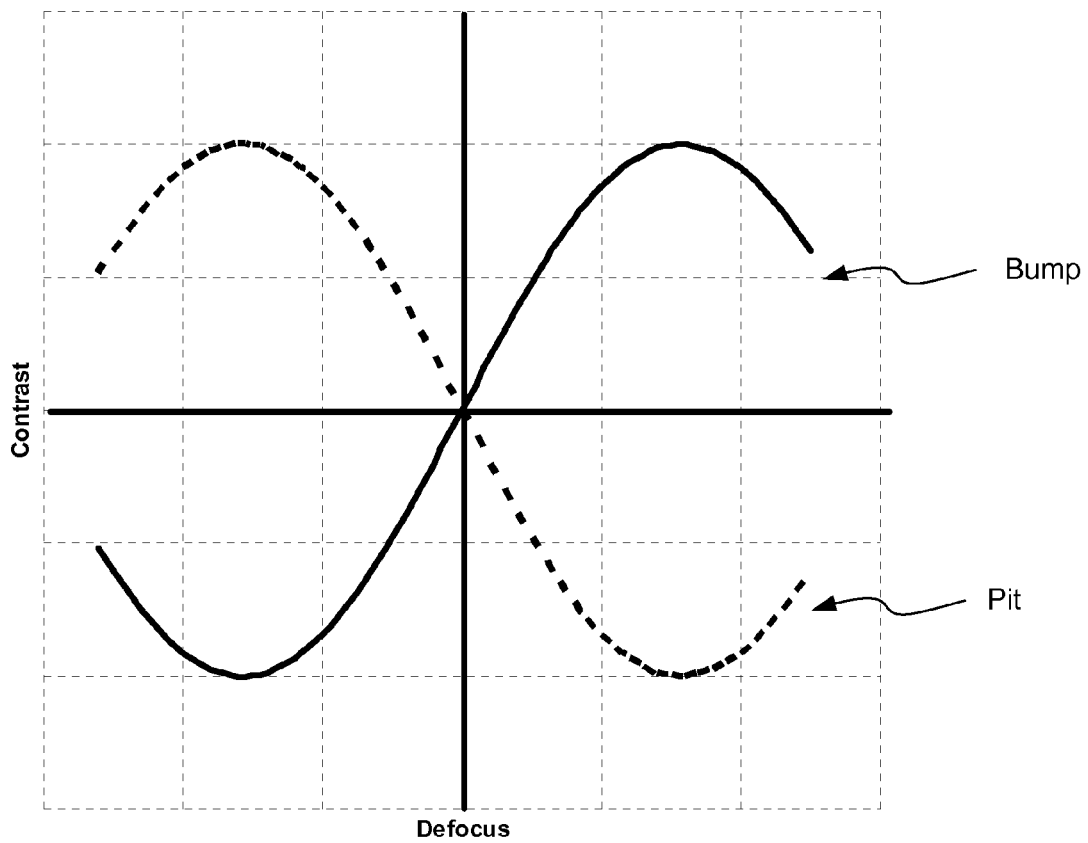
FIG. 4 is an illustrative plot of contrast as a function of focal point position for two types of phase defects.

In this last contrast expression, the contrast value is linearly proportional to the phase value ($\phi$) for small phase values. Bumps and pits will have opposite contrast signs, and the contrast sign will flip when switching from positive to negative DOF. FIG. 4 illustrates a plot of a contrast as a function of a focal point position, i.e., DOF, for two types of phase defects. One defect is a bump extending above the surface and another defect is a pit protruding below the surface. Both types of defects are shown to the have the same dimensions, e.g., 1 nanometer in height and about 70 nanometers in FWHM, and inspected using the same systems, e.g., a DUV inspection system. A contrast is nearly zero at focus, i.e., DOF~0. Therefore, phase defects are inspected using one or more defocused positions (DOF<0 or DOF>0). When multiple inspection passes are performed and/or multiple beams used in the same pass, multiple defocused settings may be used. For example, a combination of positive and negative DOFs may be used. In the same or other embodiments, a combination of defocused (DOF<0 or DOF>0) and focused positions (DOF~0) may be used. Focused positions may be used, for example, to detect particles as further explained below.

Unlike phase defects, particles have different optical properties. Particles scatter more light outside of the imaging aperture and are considered to be both amplitude and phase objects. Furthermore, particles are generally larger than typical phase defects or, more specifically, than a typical height of EUV mask blank phase defects. Therefore, different DOF are often needed for particle detection than for phase defect defection. More specifically, being mostly "amplitude objects", particles are best detected near focus (DOF~0). However, particles can still provide significant modulation even at defocused conditions.

Process Embodiments

Novel surface inspection techniques described here involve illuminating an inspected surface with a light beam that has a wavelength of less than about 250 nanometers. The beam is passed through a collection of optical elements that have a partial coherence sigma of between about 0.15 and 0.5. The beam is focused onto the inspected surface at one or more of focused and/or defocused conditions. A reflected light beam is collected by a detector and can be used to construct a resultant image of the inspected surface. This operation may involve designing and/or applying various filters and thresholds. Certain aspects of these techniques are described in the paper authored by Stan Stokowski, Joshua Glasser, Gregg Inderhees, and Phani Sankuratri, entitled "Inspecting EUV mask blanks with a 193 nm system," published in the Society of Photographic Instrumentation Engineers (SPIE) proceedings of the, volume 7636, pp. 76360Z-76360Z-9 (2010), which paper is incorporated herein by reference in its entirety.

Figure 5:
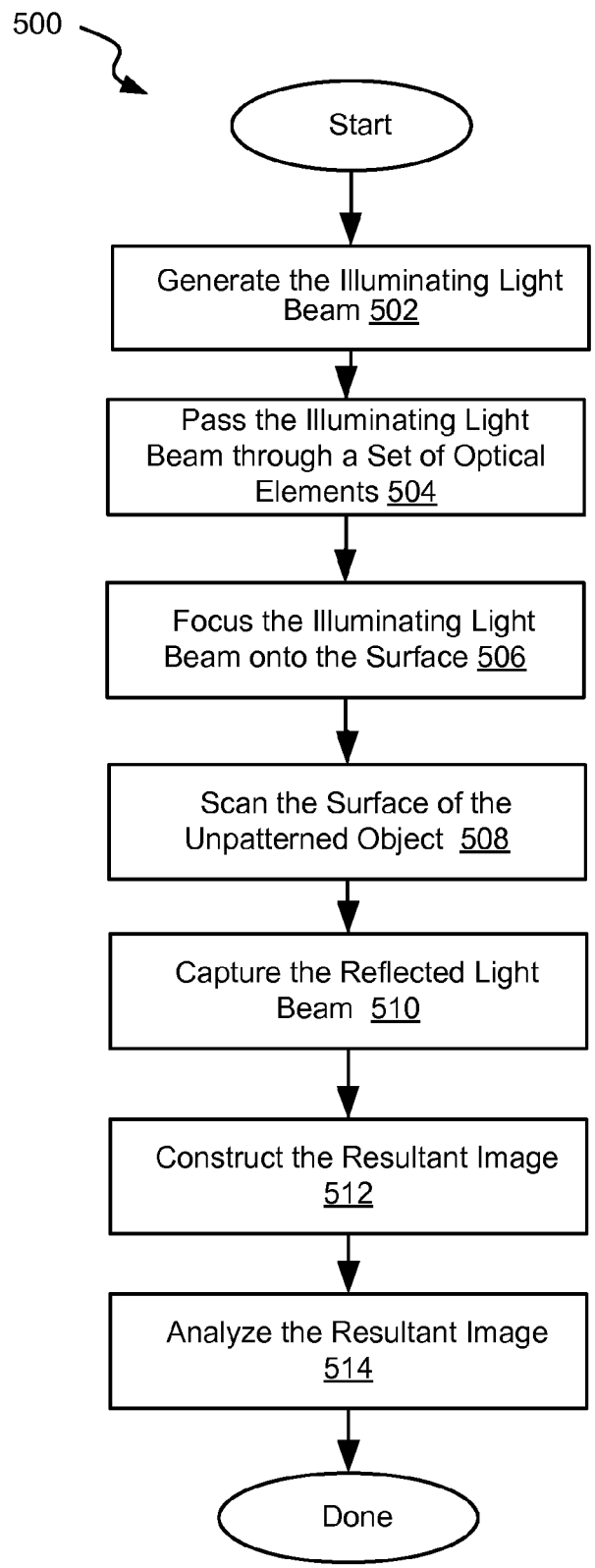
FIG. 5 is a process flowchart corresponding to a method for inspecting a surface of an unpatterned object in accordance with certain embodiments.

FIG. 5 illustrates a flowchart corresponding to a process 500 for inspecting phase defects and/or particles on a surface of an unpatterned object in accordance with certain embodiments. This process can be used to detect phase defects that are less than about 10 nanometers in height and less than about 200 nanometers in FWHM, e.g., less than about 10×200 nanometers. In more specific embodiments, these techniques are used to detect phase defects are less than about 5×150 nanometers, or less than about 3×100 nanometers, or less than about 2×80 nanometers, or even less than about 1×50 nanometers. An unpatterned object may be a EUV mask blank or any other similar transmissive object. In certain embodiments, a surface of the inspected object includes quartz and/or an anti-reflective coating (ARC).

The process 500 may start with generating an illuminating light beam (block 502). In certain embodiments, an illuminating light beam has a wavelength of less than about 250 nanometers. More specifically, an illuminating light beam may be at DUV or EUV. Various illumination sources, such as lasers, can be used for this purpose. Additional description of some illumination sources is provided below in the context of FIG. 6.

The process may proceed with passing an illuminating light beam through a collection of optical elements (block 504). Some examples of optical elements include condenser lenses, projection lenses, beam splitters, mirrors, beam steering devices, and beam conditioners. The condenser and projection lenses may be selected such that their numerical apertures result in a partial coherence sigma of the inspection system to be between about 0.15 and 0.5. It should be noted that a partial coherence sigma is a ratio of a condenser lens numerical aperture to a projection lens numerical aperture. In certain embodiments, a partial coherence sigma is between about 0.2 and 0.4 or, more particularly, between about 0.25 and 0.3, or between about 0.15 and 0.3, or between about 0.15 and 0.2.

An illuminating light beam is then focused on a surface of the inspected sample (block 506). A defocus range may be between about +1 and +3 DOF, between about −1 and −3 DOF, or between about +1 and −1 DOF. In specific embodiments, absolute DOF values (representing both negative and positive DOF ranges) are between about 1.25 and 2.75 or, more particularly, between about 1.5 and 2.5, or even about 2. In certain embodiments, a method involves illuminating the surface with multiple illuminating beams at different DOFs and/or repeating inspection passes of the surface with light beams at different DOFs. For example, two beams may have DOF values that are opposite in sign. More specifically, one beam may have a DOF of between about +1 and +3 DOF, while another at between about −1 and −3 DOF. In another example, one beam may be defocused at between about +1 and +3 DOF, while another beam may be in focus, i.e., it has a DOF of about zero. The second (in-focus) illuminating beam may generate an image (i.e., a focused image) for detecting particles and other contaminations. In general, multiple images generated at different DOF can be used to classify defects into phase and surface contamination defects. In certain embodiments, multiple images are summed up during construction of a resultant image in later operations.

The process 500 continues with inspection of the surface (block 508) and capturing one or more reflected light beams using one or more detectors (block 510). A reflected light beam or at least a captured portion of that beam can be characterized based on a resolution of the detector. In certain embodiments, a reflected light beam's scan path across the detector is between about 100 pixels and 1000 pixels wide along a scanning direction or, more particularly, between about 300 pixels and 600 pixels wide. A length of the beam path may be at least about 500 pixels or, more particularly, at least about 1000 pixels. If multiple reflected beams are produced, then a multi-field detector can be used to captures these beams.

The process 500 may proceed with constructing a resultant image (block 512) and analyzing the resultant image to identify various defects (block 514). This construction and analysis process may involve summing or comparing multiple images, applying various filters, thresholds, concentration values, as well as performing other techniques. Since EUV mask blanks are unpatterned objects, most or nearly all systematic noise sources can be eliminated during these operations. For example, a systematic noise can be monitored and filtered from the detected signal or image. By eliminating most of the systemic noise, the remaining signal can still contain some random noise, shot, and speckle. However, an actual non-noisy signal and signals produced by these noise factors have different spatial power spectra and can be decoupled from each other. Therefore, a filter can be designed and applied to further improve a SNR. In certain embodiment, application of filters can increase SNRs at least about twice or at least about three times or even at least about four times. It has been found that better "matched" filters can be designed when a partial coherence sigma is set to less than about 0.25, or even less than about 0.20.

In certain embodiments, a correction factor is applied to remove a systematic noise from the resultant image caused by pixel-to-pixel differences in the TDI gain and offsets. For example, a correction factor may be determined from a calibration procedure and applied during inspection/scanning. Further, as inspection occurs, in the absence of any detected defect, the mean value of each pixel row is monitored and determines the correction factor applied.

In certain embodiments, analyzing the resultant image comprises applying a threshold signal value of at least about 7 to detect phase defects. A threshold signal value is defined as a ratio to a standard deviation of the noise signal. Another way of increasing SNRs is to perform multiple inspection passes. However, each additional inspection pass slows inspection system throughput.

In certain embodiments, an illuminating light beam is focused onto the surface at a substantially normal angle, which results in illuminating and reflected light beams sharing their paths. In other embodiments, an illuminating light beam is focused onto the surface at an oblique angle, and the illuminating and reflected light beams do not share their paths. In another embodiment, a zero order component of the reflected light beam may be further attenuated prior to reaching a detector. Furthermore, a phase of the zero order component of the reflected light beam can be shifting using an imaging aperture in order to improve the contrast and a signal-to-noise ratio.

Apparatus Embodiments

In certain embodiments, a system for inspecting phase defects on a surface of an unpatterned object includes a light source for generating an illuminating light beam having a wavelength less than about 250 nanometers and a collection of optical elements that has a partial coherence sigma of between about 0.15 and 0.5. These optical elements may be used to focus the illuminating light beam onto the inspected surface at one or more DOF values listed above. Furthermore, the inspection system may include a stage for moving the unpatterned object with respect to the illuminating light beam to inspect the surface of the unpatterned object. One or more reflected light beams may be captured by a detector, such as a time delay integration (TDI) detector. Certain apparatus details are also described in the presentation by W. H. Broadbent, D. S. Alles, M. T. Giusti, D. F. Kvamme, R.-F. Shi, W. L. Sousa, R. Walsh, Y. Xiong, entitled "Results from a new 193 nm Die-to-database Reticle Inspection Platform," presented during the Photomask Japan 2010 conference, held in Yokohama Japan on 13-15 Apr. 2010, which is incorporated herein by reference in its entirety. Other description is provided in U.S. Pat. No. 6,271,916 and U.S. Pat. No. 6,201,601, which are also incorporated herein by reference in their entireties.

As mentioned above one example of a specifically configured inspection system is the Teron 600 available from KLA-Tencor in Milpitas, Calif. This system is a recently developed 193-nm wavelength high resolution reticle defect inspection platform that can operate in both die-to-database and die-to-die inspection modes. This system is suitable for both optical and EUV applications.

In general, an inspection system may include multiple enclosures. One enclosure, such as a main enclosure, may include optics, stage, and/or sample loader. This enclosure is designed to minimize vibration, heat fluctuations, and contamination so as to provide adequate performance. In a separate location, a system may include various support systems, such as blowers, heat exchangers, control electronics, and power supplies. Keeping these components separate minimizes impact to the sensitive optics.

Figure 6:
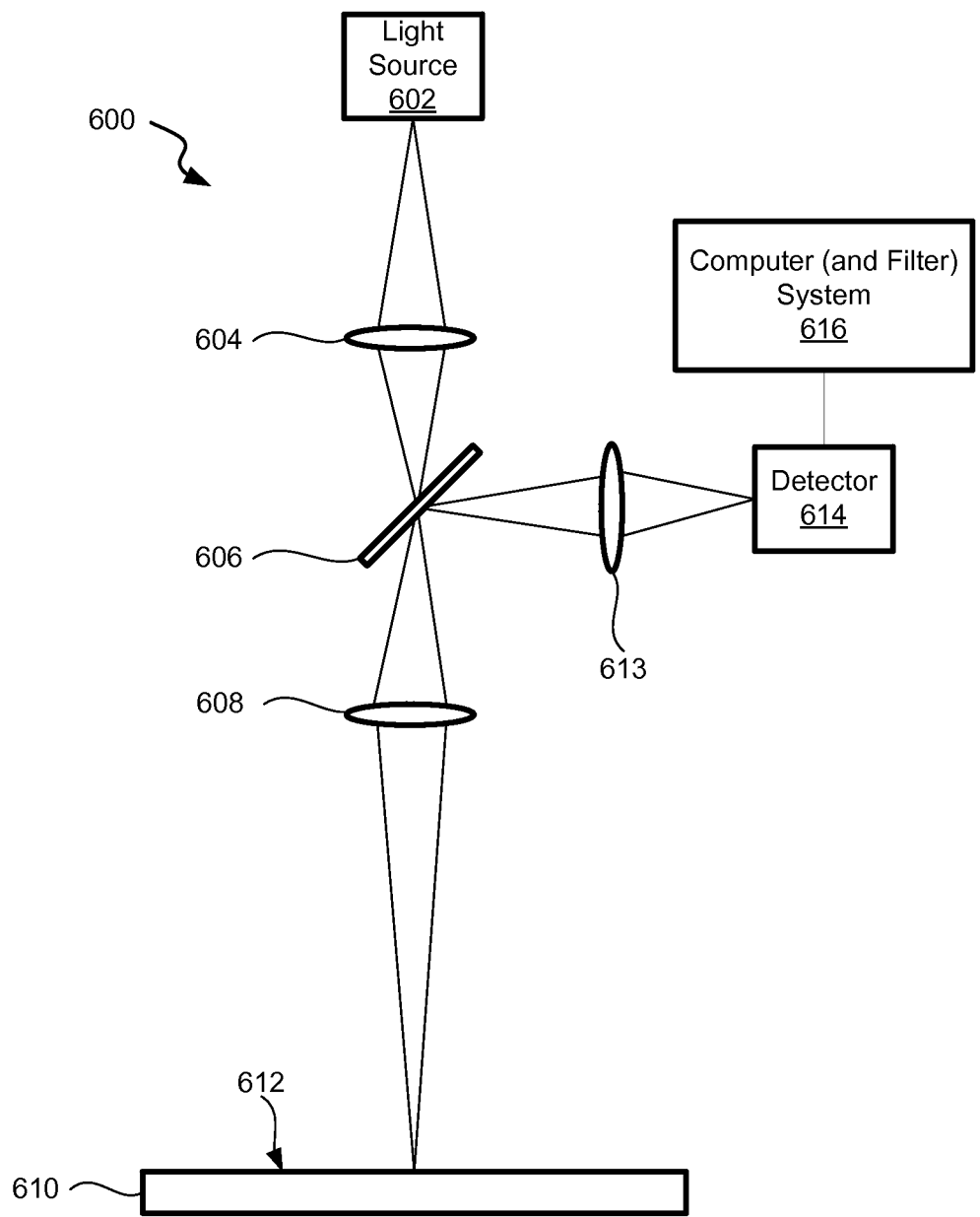
FIG. 6 is a schematic representation of some elements of an inspection system for inspecting a surface of an unpatterned object in accordance with certain embodiments.

FIG. 6 is a schematic illustration of some elements of an inspection system in accordance with certain embodiments. A system 600 includes a light source 602 that may provide a coherent light beam. One example of a light source is a quasi-continuous wave laser. A light source should generally provide high pulse repetition rate, low-noise, high power, stability, reliability, and extendibility. A light source may include a beam steering device for precise beam positioning and a beam conditioning device, which can be used to provide light level control, speckle noise reduction, and high beam uniformity. It should be noted that a beam steering and/or beam conditioning devices may be separate physical devices from, for example, a laser.

An inspection system includes a collection of optical elements that have a partial coherence sigma of one or more values described above. These elements are also used to focus an illuminating light beam onto the inspected surface 612 at various DOF values, which are also described above. For brevity, FIG. 6 illustrates only a condenser lens 604, an imaging lens 608, a detector lens 613, and a beam splitter 606. However, one skilled in the art would understand that an inspection system can include other optical elements needed to achieve specific inspection functions. The imaging lens 608 may be relatively large in order to meet specific low aberration requirements. The imaging lens can be adjusted to different sizes of pixels, e.g., less than about 100 nm for each pixel or, more particularly, less than about 75 nm or even less than 60 nm. The inspection system may be able to inspect the surface 612 simultaneously at different DOF values.

The reflected beam is then transmitted to a detector 614. In certain embodiments, the detector is a time delay integration (TDI) detector. A typical TDI detector accumulates multiple exposures of the same area of the inspected surface, effectively increasing the integration time available to collect incident light. The object motion is synchronized with the exposures to ensure a crisp image. In general, a detector may include transducers, collectors, charge-coupled devices (CCDs) or other types of radiation sensors.

FIG. 6 shows an example where an illuminating light beam is directed towards the sample surface 612 at a substantially normal angle with respect to the inspected surface. In other embodiments, an illuminating light beam can be directed at an oblique angle, which allows separation of the illuminating and reflected beams. In these embodiments, an attenuator may be positioned on the reflected beam path in order to attenuate a zero order component of the reflected light beam prior to reaching a detector. Furthermore, an imaging aperture may be positioned on the reflected beam path to shift the phase of the zero order component of the reflected light beam.

A detector is typically attached to a computer (and filter) system 616 or, more generally, to a signal processing device, which may include an analog-to-digital converter configured to convert analog signals from the detector 614 to digital signals for processing. The computer system 616 may be configured to analyze intensity, phase, and/or other characteristics of one or more reflected beams. The computer system 616 may be configured (e.g., with programming instructions) to provide a user interface (e.g., a computer screen) for displaying a resultant test image and other inspection characteristics. The computer system 616 may also include one or more input devices (e.g., a keyboard, mouse, joystick) for providing input, such as changing DOF. The computer system 616 may also be connected to the stage 610 for controlling, for example, a sample position (e.g., focusing and scanning) and other inspection parameters and configurations of the inspection system elements. In certain embodiments, the computer system 616 is configured to carry out inspection techniques detailed above. The computer system 610 typically has one or more processors coupled to input/output ports, and one or more memories via appropriate buses or other communication mechanisms.

Because such information and program instructions may be employed to implement the systems/methods described herein, the present invention relates to machine readable media, which include program instructions/computer code, for performing various operations described herein. Examples of machine-readable media include, but are not limited to, magnetic media such as hard disks, floppy disks, and magnetic tape; optical media such as CD-ROM disks; magneto-optical media such as optical disks; and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter.

Experimental

A series of experiments were conducted to identify phase defects and particles on typical multilayer EUV mask blank surfaces as well as quartz surfaces. In one experiment, a programmed-defect mask that contains multiple bump arrays of known sizes was inspected using a specifically configured KLA-Tencor Teron 600 DUV inspection system. The programmed-defect mask included 13 blocks of phase bumps of increasing size. For example, block 12 had 1 nanometer high× 90 nanometers FWHM defects, block 11 had 1.5×100 nanometers defects, while blocks 1-10 had increasingly larger defects. The Teron 600 system demonstrated a capture probability of 100% for blocks 1-11 and a capture probability of 74% for block 12.

Figure 7:
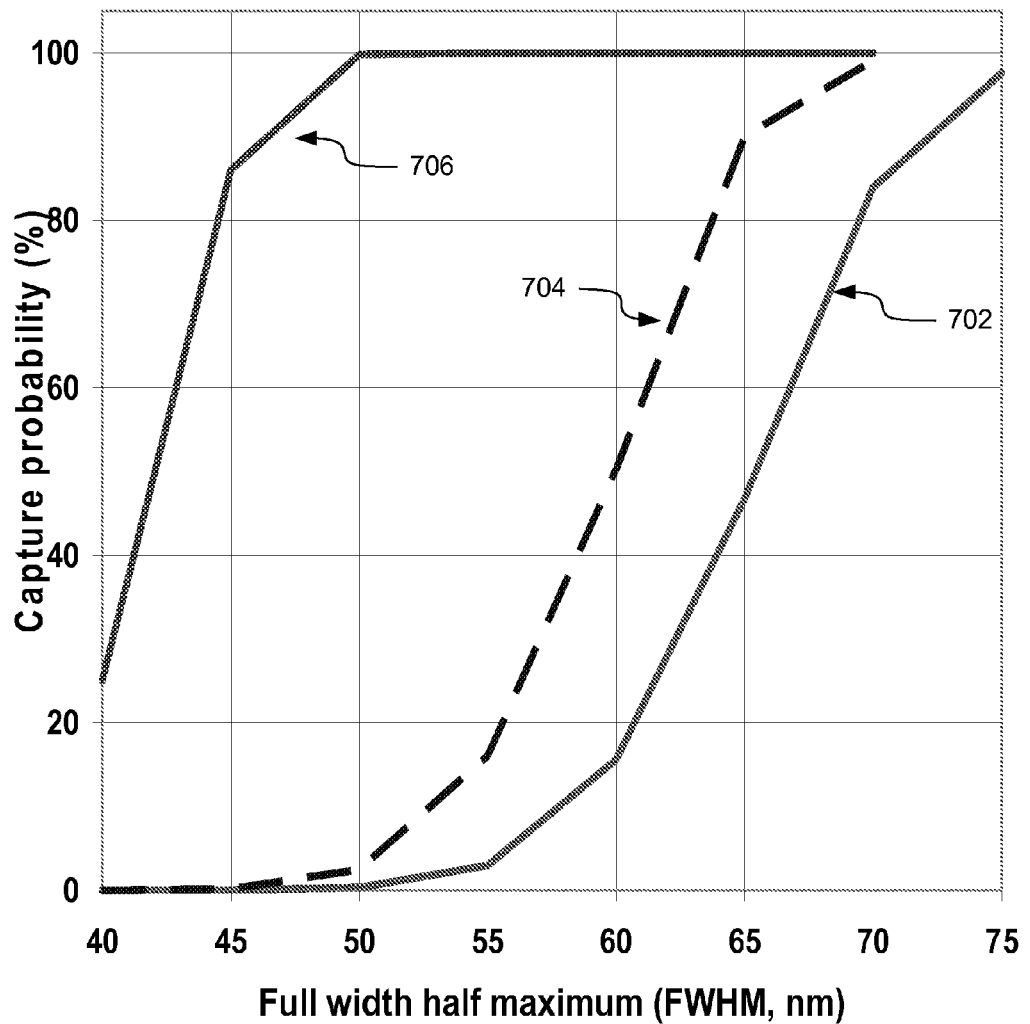
FIG. 7 is a plot of capture probabilities as a function of full width half maximum (FWHM) for a 1 nanometer high phase defect in accordance with certain embodiments.

Based on these experimental results, additional changes to the inspection system were made. For example, filters (616 of FIG. 6) applied to the resultant images were better tuned for surface roughness. Furthermore, capture probabilities of a 1 nanometer high phase defect has been estimated where a FWHM was an independent variable. These estimates are presented in FIG. 7. The left most curve 702 corresponds to initial inspection parameters used for inspection of samples with a typical surface roughness. The capture rate drops sharply for defects that are narrower than 70 nanometers FWHM. New filters and other inspection parameters allowed improving sensitivity by additional 5-7 nanometers as evidenced from the middle curve 704. However, substantially better results can be achieved for samples with a lower surface roughness. The left-most curve 706 represents a probability curve for samples that have a 2.5 times lower surface roughness.

Figure 8A:
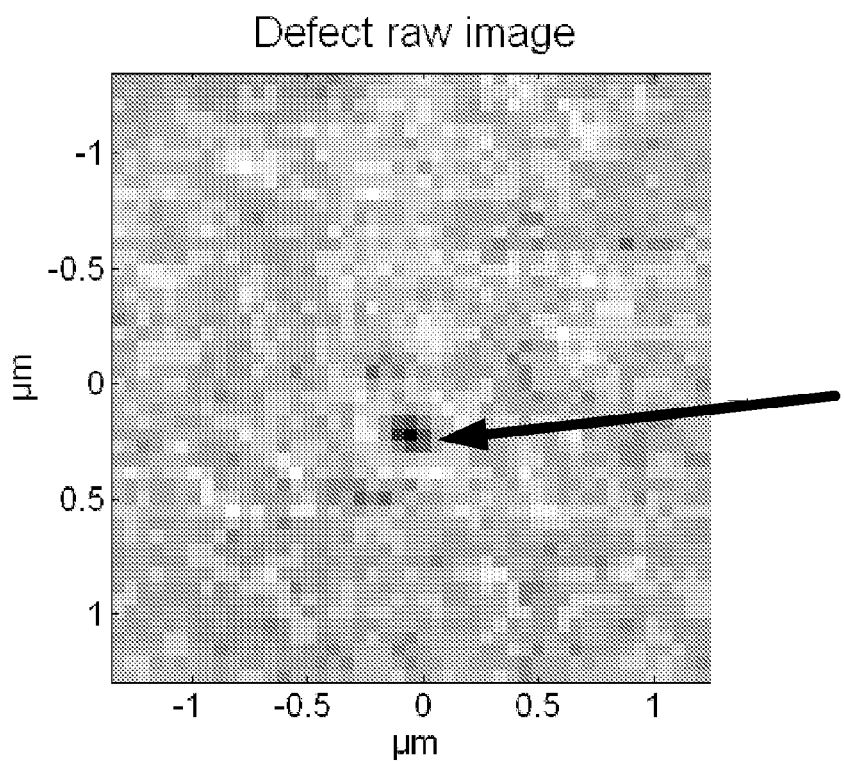
FIGS. 8A and 8B illustrate raw and interpolated images of a 2 nanometers high 80 nanometers FWHM bump on a silicon-capped multilayered sample.
Figure 8B:
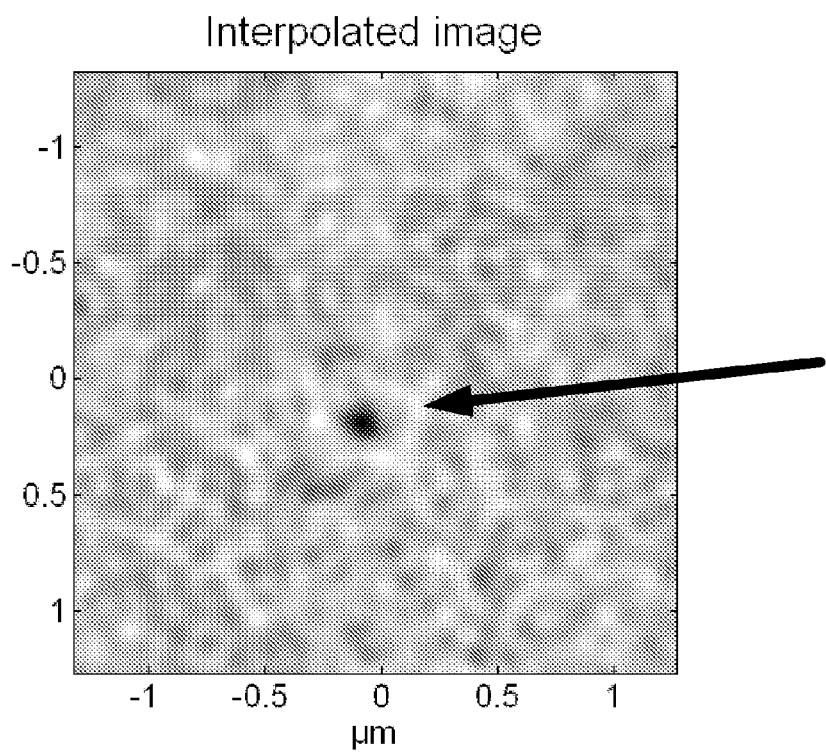

In another experiment, bump and pit defects having a size of 2×80 nanometers on a silicon-capped multilayered sample were inspected and images were analyzed. All defects were captured at 100% rate. FIGS. 8A and 8B illustrate a raw and an interpolated image of one bump defect. Even a relatively small defect is clearly distinguishable on the images.

Another experiment was conducted to investigate effects of inspection passes on reflectivity of ruthenium (Ru) and silicon (Si) capped multilayered samples. This experiment was conducted to alleviate any concerns that DUV or EUV exposure during inspection (i.e., at inspection intensity levels) may cause reflectivity changes. The experiment involved 20 to 50 inspection passes performed on each sample. Both DUV and EUV exposure at maximum inspection intensities were used. The reflectivity before and after this repetitive inspection was measured at 13.5 nm and the film structure was measured using an X-ray reflectivity (XRR) technique. No measurable changes in reflectivity were detected.

Figure 9A:
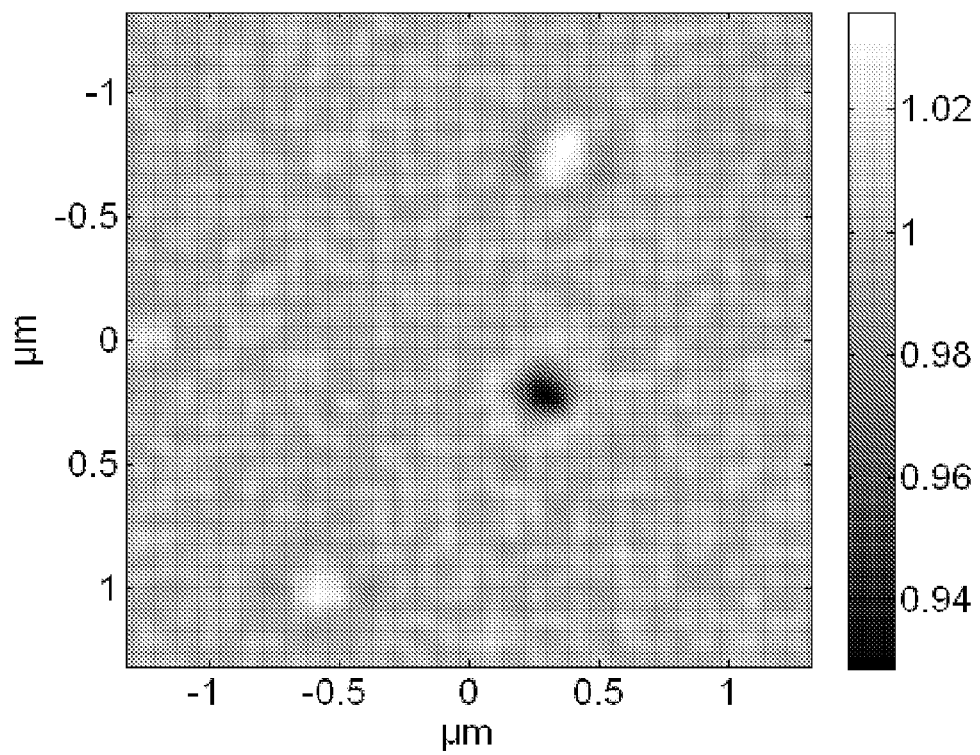
FIGS. 9A and 9B illustrate two images of various defects on quartz substrate surfaces.
Figure 9B:
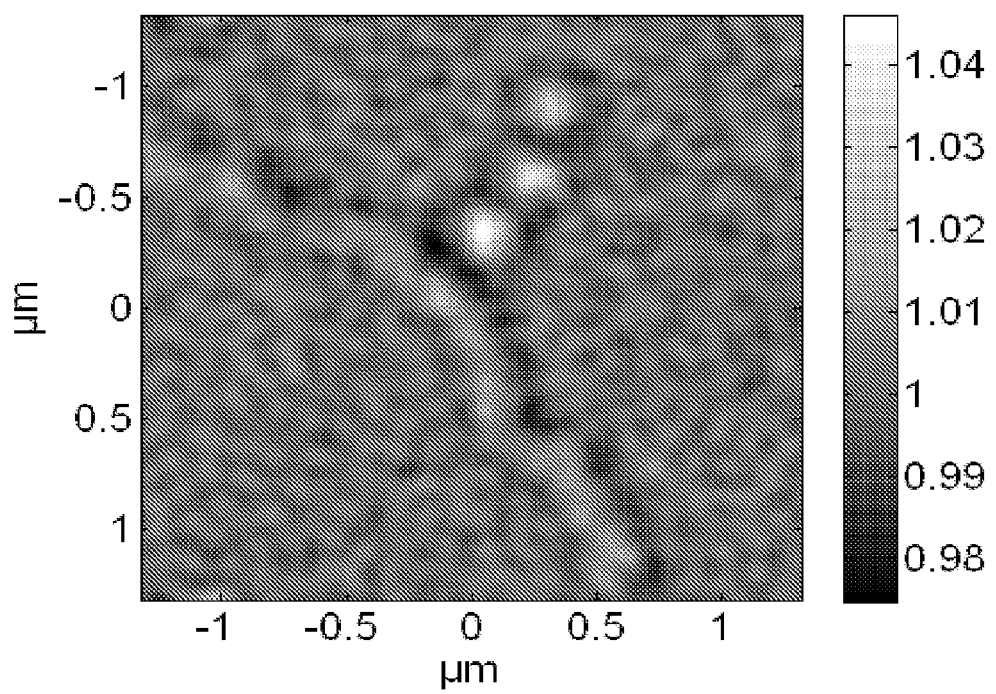

In another experiment, defects on quartz substrate surfaces were analyzed. Quartz substrates generally have a relatively low reflectance in comparison to silicon capped or ruthenium capped substrates. As such, these substrates may need a considerably higher illumination intensity in order to achieve an adequate SNR. FIGS. 9A and 9B illustrate two images of various defects on quartz surfaces. FIG. 9A shows both pits, which are two bright spots, and a bump, which a dark spot. FIG. 9B also show three pits. Furthermore, the meandering line in FIG. 9B is believed to be an indication of a film contamination on the quartz.

Overall, these experiments showed that the 22-nm node requirements for phase defect detection would be met using the inspection methods and apparatuses described herein. It is expected that a surface roughness of EUV mask blank will decrease in the future, which would further increase sensitivity limits of the proposed methods and apparatuses.

CONCLUSION

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

What is claimed is:

1. A method for inspecting phase defects and/or particles on a surface of an unpatterned object, the method comprising:
   generating an illuminating light beam
   passing the illuminating light beam through a set of optical elements with a partial coherence sigma to between about 0.15 and 0.5;
   focusing the illuminating light beam onto the surface of the unpatterned object at a predetermined defocus range;
   inspecting the surface of the unpatterned object with the illuminating light beam at the predetermined defocus range so that a reflected light beam reflects from the surface; and
   based on the reflected light beam at the predetermined defocus range, constructing and analyzing a resultant image to identify the phase defects so as to distinguish between pit defects and bump defects.

2. The method of claim 1, wherein the phase defects are less than about 10 nanometers in height and less than about 200 nanometers in a full width at half maximum (FWHM).

3. The method of claim 1, wherein the phase defects are less than about 2 nanometers in height and less than about 100 nanometers in FWHM.

4. The method of claim 1, wherein the predetermined defocus range includes a first sub-range that is between about +1 and +3 depth of field (DOF) and a second sub-range that is between about −1 and −3 DOF.

5. The method of claim 1, wherein the resultant image comprises applying a filter to the resultant image or a detected signal generated from the reflected light beam so as to maximize a signal-to-noise (SNR) ratio in the resultant image or detected signal.

6. The method of claim 1, further comprising applying a correction factor to remove a systematic noise comprising TDI calibration effects from the resultant image.

7. The method of claim 6, wherein the correction factor is determined and applied during inspecting from initial capturing of the reflected light beam.

8. The method of claim 6, wherein the correction factor is determined from intensity variations of a reflected light.

9. The method of claim 1, wherein analyzing the resultant image comprises applying a threshold signal value of at least about 7 to detect phase defects.

10. The method of claim 1, wherein the unpatterned object comprises an Extreme Ultraviolet Mask (EUV) blank.

11. The method of claim 1, wherein the unpatterned object is a transmissive object.

12. The method of claim 1, wherein the surface of the unpatterned object comprises quartz or an anti-reflective coating (ARC).

13. The method of claim 1, wherein constructing and analyzing the resultant image comprises capturing reflected light with a dual-field TDI detector configured to construct two initial images of the surface of an unpatterned object.

14. The method of claim 13, wherein the two initial images are constructed for two different defocus values.

15. The method of claim 14, wherein the two different defocus values are opposite in sign.

16. The method of claim 14, wherein the two initial images comprise a focused image constructed for a DOF of about zero.

17. The method of claim 16, wherein the focused image is used to detect contaminations on the surface of the unpatterned object.

18. The method of claim 16, further comprising classifying defects into phase defects and surface contamination defects based on comparison of the two initial images.

19. The method of claim 13, wherein constructing the resultant image comprises summing up the two initial images.

20. The method of claim 1, further comprising performing additional inspection passes of the surface of the unpatterned object and constructing additional resultant images that are combined with the resultant image to increase a signal-to-noise ratio.

21. The method of claim 1, wherein the illuminating light beam is focused onto the surface of the unpatterned object at a substantially normal angle, and wherein the illuminating light beam and the reflected light beam share their paths.

22. The method of claim 1, wherein the illuminating light beam is focused onto the surface of the unpatterned object at an oblique angle, and wherein the illuminating light beam and the reflected light beam do not share their paths, the method further comprising:
    attenuating a zero order component of the reflected light beam;
    shifting a phase of the zero order component of the reflected light beam using an imaging aperture to improve the contrast and a signal-to-noise ratio.

23. The method of claim 1, wherein the illuminating light beam has a wavelength in the deep UV or an extreme UV range.

24. A system for inspecting surface unevenness defects of less than about 10 nanometers in depth on a surface of an unpatterned object, the system comprising:
    a laser for generating an illuminating light beam;
    a set of optical elements with a partial coherence sigma to between about 0.15 to 0.5 for focusing the illuminating light beam onto the surface of the unpatterned object within a focus range of between about −3 to +3 depth of field (DOF), including a defocused value;
    a stage for moving the unpatterned object with respect to the illuminating light beam to inspect the surface of the unpatterned object;
    a time delay integration (TDI) detector for capturing a reflected light beam reflected from the surface in response to the illuminating beam; and
    a computer system comprising at least one memory and at least one processor for causing the set of optical elements to focus the illuminating light beam onto the surface of the unpatterned object at a predetermined defocus range and, based on the reflected light beam at the predetermined defocus range, constructing a resultant image and analyzing the resultant image to identify the surface unevenness defects so as to distinguish between pit defects and bump defects.

25. The system of claim 24, wherein the unevenness defects comprise phase defects that are less than about 10 nanometers in height and less than about 200 nanometers in a full width at half maximum (FWHM).

26. The system of claim 24, wherein the predetermined defocus range includes a first and second predetermined defocus range wherein the first predetermined defocus range is between about +1 and +3 depth of field (DOF) and the second predetermined defocus range is between about −1 and −3 DOF.

27. The system of claim 24, wherein the predetermined defocus range includes two different opposite sign defocus values.

28. The system of claim 24, wherein the predetermined defocus range includes a defocus value and a focused value of about zero.

29. The system of claim 24, wherein the computer system is further configured for constructing and analyzing two initial images.

30. The system of claim 29, wherein the two initial images are constructed from the illumination light beam being focused at two different defocus values.

31. The system of claim 30, wherein the two different defocus values are opposite in sign.

32. The system of claim 29, wherein the two initial images are constructed from the illumination light beam being focused at an unfocused value and a focused value having a depth of field of about zero.

33. The system of claim 32, further comprising classifying defects into phase defects and surface contamination defects based on comparison of the two initial images.

34. The system of claim 24, wherein the illuminating light beam has a wavelength in the deep UV or an extreme UV range.

35. The system of claim 24, wherein constructing a resultant image comprises applying a filter to the resultant image or a detected signal generated from the reflected light beam so as to maximize a signal-to-noise (SNR) ratio in the resultant image or detected signal.

36. The system of claim 35, wherein applying the filter comprises applying a matched filter.

37. The method of claim 24, wherein applying a filter comprises applying a matched filter.

* * * * *